United States Patent [19]

Davis et al.

[11] Patent Number: 4,602,838
[45] Date of Patent: Jul. 29, 1986

[54] ELECTRONIC KEY ASSEMBLIES

[75] Inventors: Wayne S. Davis, Harrisburg; George R. Defibaugh, Camp Hill; Jon A. Fortuna, New Cumberland, all of Pa.

[73] Assignee: AMP Incorporated, Harrisburg, Pa.

[21] Appl. No.: 762,793

[22] Filed: Aug. 2, 1985

Related U.S. Application Data

[63] Continuation of Ser. No. 661,498, Oct. 16, 1984, abandoned.

[51] Int. Cl.$^4$ .......................................... H01R 13/648
[52] U.S. Cl. ................................ 339/91 R; 339/14 R; 339/143 R; 339/147 P; 339/206 R
[58] Field of Search ............ 339/91 R, 147 R, 147 P, 339/143 R, 14 R, 136 R, 136 M, 206 R, 213 R

[56] References Cited

U.S. PATENT DOCUMENTS

| | | | |
|---|---|---|---|
| 4,206,962 | 6/1980 | Shue, Jr. et al. | 339/147 R |
| 4,274,698 | 6/1981 | Ahroni | 339/147 P |
| 4,337,989 | 7/1982 | Asick et al. | 339/143 R |
| 4,406,509 | 9/1983 | Jagen | 339/91 R |
| 4,457,575 | 7/1984 | Davis et al. | 339/176 MP |
| 4,489,997 | 12/1984 | Byrne | 339/14 R |

Primary Examiner—John McQuade
Attorney, Agent, or Firm—Robert W. J. Usher

[57] ABSTRACT

An electronic key assembly (10) comprising an insulating plug body (11) having a front mating end (17) for receipt in a jack and a rearwardly spaced, chip carrier receiving cavity (19). A series of contacts (12) having first contact portions (34) are mounted in body recesses (32) at the mating end for engagement with spring contacts of a complementary jack and second spring contact portions (36) which extend into the cavity (19) are for engagement with respective leads of a chip carrier (15) received therein. Releasable latch arms (41) extend rearwardly from the mating end (17) and a sleeve-form shield (12) moulded in the fingerpiece (14) is received on the body (11) to surround a rear end and the chip carrier (15). Anti-overstress arms (64) extending from the fingerpiece (14) hook over the latch arms (41) to prevent excessive movement of the latch arms (41) away from the body (11).

15 Claims, 13 Drawing Figures

ELECTRONIC KEY ASSEMBLIES

This application is a continuation of application Ser. No. 661,498 filed Oct. 16, 1984, now abandoned.

The invention relates to electronic key assemblies.

In order to prevent unauthorized entry or use of a facility such as a computer program, it has been proposed to require the use of an electronic key in the form of a preprogrammed microcircuit chip to gain access to the facility.

In one particular application, concerning computer software, the electronic key would be supplied to an authorized user with the disc or tape carrying the program. Use of the program would then only be possible when a compatible signal had been received from the key connected to the terminal.

It is clearly desirable that the key can be readily manipulated by the user, is significantly rugged to withstand handling abuse, easily connected and disconnected from the equipment.

An electrical socket connector incorporating an integrated circuit is disclosed in U.S. Pat. No. 4,206,962. However, the connector is not compatible with standard modular jacks commonly used in the data industries. The integrated circuit is relatively insecure and electrically unshielded.

An example of such modular jacks (and compatible plugs) is disclosed in U.S. Pat. No. 4,457,575.

In the standard jacks, a row of spring contacts extend from one side of a mating face, rearwardly, cantilever fashion, across a plug receiving socket, obliquely of the mating axis. Compatible plugs each include a row of contacts extending across one side of an insulating plug body at a mating end for engagement with respective socket contacts on insertion of the plug into the socket.

In addition, the key should be capable of economic manufacture, desirably using standard chip carriers permitting surface mounting with minimal modification.

According to one aspect of the invention, the key comprises an insulating plug body moulded from plastics material having a front mating end for receipt in a jack and a rear end, and formed with a chip carrier receiving cavity spaced rearwardly from the mating end; a row of contact receiving recesses extending rearwardly from the mating end along a side of the body towards the cavity; a series of contacts having first contact portions mounted in the recesses for engagement with spring contacts of a complementary jack and second spring contact portions extending into the cavity for engagement with respective leads of a chip carrier received in the cavity; releasable latch arm means extending rearwardly from the mating end; and, a sleeve-form shield receivable on the body surrounding the rear end and extending forwardly over the cavity towards the mating end thereby completely to enclose and shield the chip carrier in the cavity.

Preferably, the shield is anchored in a fingerpiece at one axial end, to facilitate handling. To enable the key to be carried by the user and consequential rough handling, anti-overstress means extends forwardly from the fingerpiece trapping the latch arm to prevent excessive movement thereof away from the body.

More particularly, the latch arm is formed with a forwardly facing shoulder adjacent its rear end and the overstress means comprises a rearwardly facing hook engaging the shoulder.

Conveniently, the latch arm is stepped outwardly towards its free end to provide the shoulder.

In one example, the fingerpiece is moulded from plastics material with the overstress means integral therewith, the shield being inmoulded with the fingerpiece.

This provides a rugged and compact key assembly which incorporates a standard chip carrier with minimal modification, is economical to manufacture by mass production techniques, and which is also compatible with existing standard modular jack structures.

Examples of key assemblies according to the invention will now be described with reference to the accompanying drawings in which:

FIG. 9 is a cross-sectional view of the assembly taken along line 9—9 of FIG. 8;

Figures 1, 2:
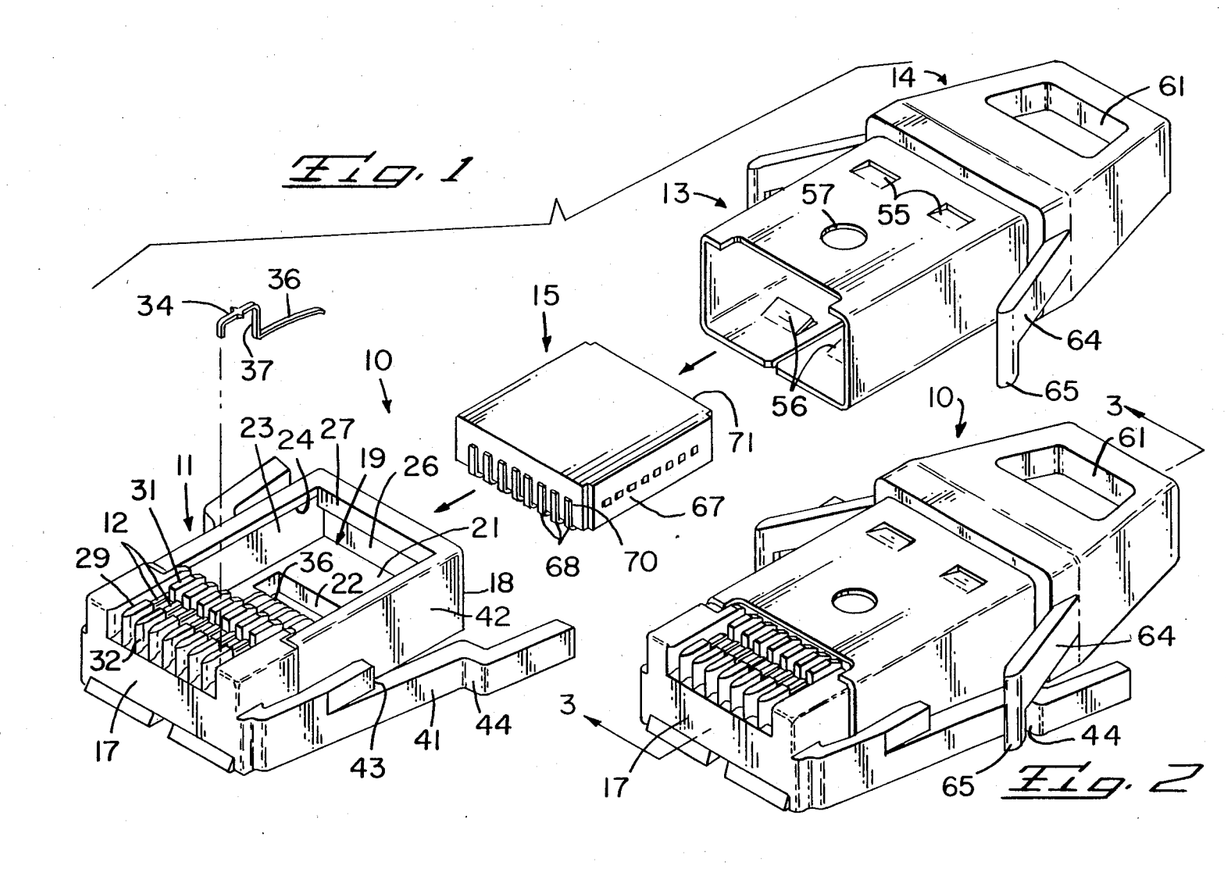
FIG. 1 is an exploded isometric view of a first example of a key assembly according to the invention.
FIG. 2 is an isometric view of the assembly of FIG. 1.
Figure 3:
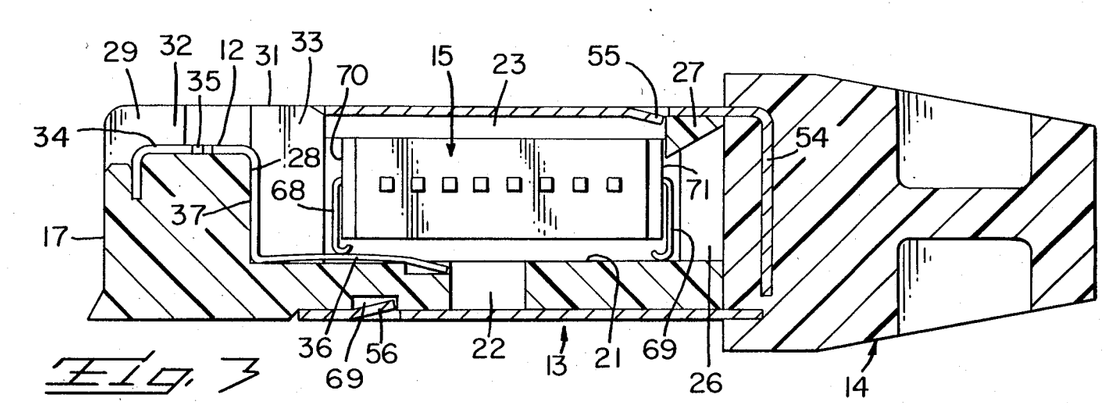
FIG. 3 is a cross-sectional view of the assembly taken along line 3—3 of FIG. 2.

In the first example, shown in FIGS. 1 to 3, the key assembly 10 comprises an insulating plug body 11, housing a series of contacts 12, a sleeve-form shield 13 inmoulded in a plastics fingerpiece 14 and a chip carrier 15 incorporating a programmed chip (not shown).

The external profile of the plug body 11 is similar to that described in U.S. Pat. No. 4,457,575 and is adapted to mate with a suitable conventional jack. Briefly described, the plug body 11 has a front mating end 17 and a rear end 18. A chip carrier receiving cavity 19 is formed adjacent the rear end 18 spaced from the mating face and comprises a base 21 with a transverse aperture 22, opposed side walls 23 upstanding from the base 21 and having an overhanging upper edge 24. The cavity is provided with a chip carrier admitting opening 26 at the rear across which extends a latching detent 27 integral with the upper edges 24 of the side walls 23. Two spaced rows of spaced barrier walls 29 and 31 outstand respectively from a depression in a side of the body between the mating end 17 and the cavity 19 and the front wall 28 of the cavity defining between them contact receiving recesses 32, 33 extending rearwardly from the mating end towards the cavity and down the cavity wall 28 to the base 21.

Stamped and formed metal contacts 12 each have a first contact portion 34 anchored in the depression by barbs 35, a body portion 37 extending along the front wall 28 of the cavity between barriers 31, and a second contact portion 36 extending across the cavity base 21 in parallel, spaced apart relation and bowed upwardly to constitute a beam spring portion, anchored at free ends by tangs in recesses adjacent aperture 22.

Latch arms 41 extend rearwardly from root ends integral with opposite sides 42 of the body at the front end 17 and are formed with rearwardly facing latching shoulders 43 at intermediate locations. The arms are stepped outwardly of the plug body adjacent their rear, free, ends to provide forwardly facing shoulders 44 for cooperation with anti-overstress means described below.

The shield 13 is stamped and formed from sheet metal stock as an open-seamed rectangular-section tube with a flap 54 closing one end which is inmoulded in the plastics fingerpiece 14. The shield is formed with latching detents 55 and 56 on upper and lower sides. An aperture 57, to admit potting material, is formed in the upper side.

The fingerpiece 14 is of rearwardly tapering cross section and includes finger receiving recesses 61 on upper and lower faces. Extending forwardly in divergent fashion from opposite sides with which they are integrally joined are anti-overstress cantilever arms 64 having hooked ends 65 which extended laterally of the plug body when the finger piece is assembled herewith.

The chip carrier 15 is of standard type having leads moved from opposite side faces 67 to facilitate receipt in the cavity, leaving a row of eight leads 68 and 68' on front and rear faces 70 and 71.

To assemble the key, the chip carrier 15 is inserted through the rear opening 26 into the cavity by resilient flexure of the detent 27 so that the chip carrier is trapped by the detent 27 and the overhanging upper edges. The leads 68 wipe across respective second contact portions 36 during insertion with flexure of both to establish connection therebetween.

The shield carrying the fingerpiece is then slid over the rear of the plug body with the chamfered hooked portions 65 initially camming the free ends of the latch arms 41 inwardly and ultimately snapping behind the shoulders 44. The detents 55 and 56 snap into recesses 69 on the underside of the plug body and behind detent 27, respectively, to latch the shield permanently onto the body. Potting material can then be injected through opening 57, if desired.

A rugged and compact structure is thus formed by mass production techniques. Overstress of the latch arms 41 away from the body is prevented by the anti-overstress arms 64 enabling the key assembly to be freely handled and carried by the user.

A minimum of modification, both of the conventional plug design and chip carrier, is needed and the plug is compatible with conventional jacks being readily plugged and unplugged from the computer terminal.

A further advantage of the particular contact construction is that a smooth, unsheared surface of the contact portions engages the jack contacts rather than the rough sheared edge of conventional wire connecting contacts. This enhances contact life and the reliability of the electrical connection.

The aperture 22 is provided to admit a shear blade to sever the contacts from a carrier strip after receipt in the housing.

Figures 4, 5:
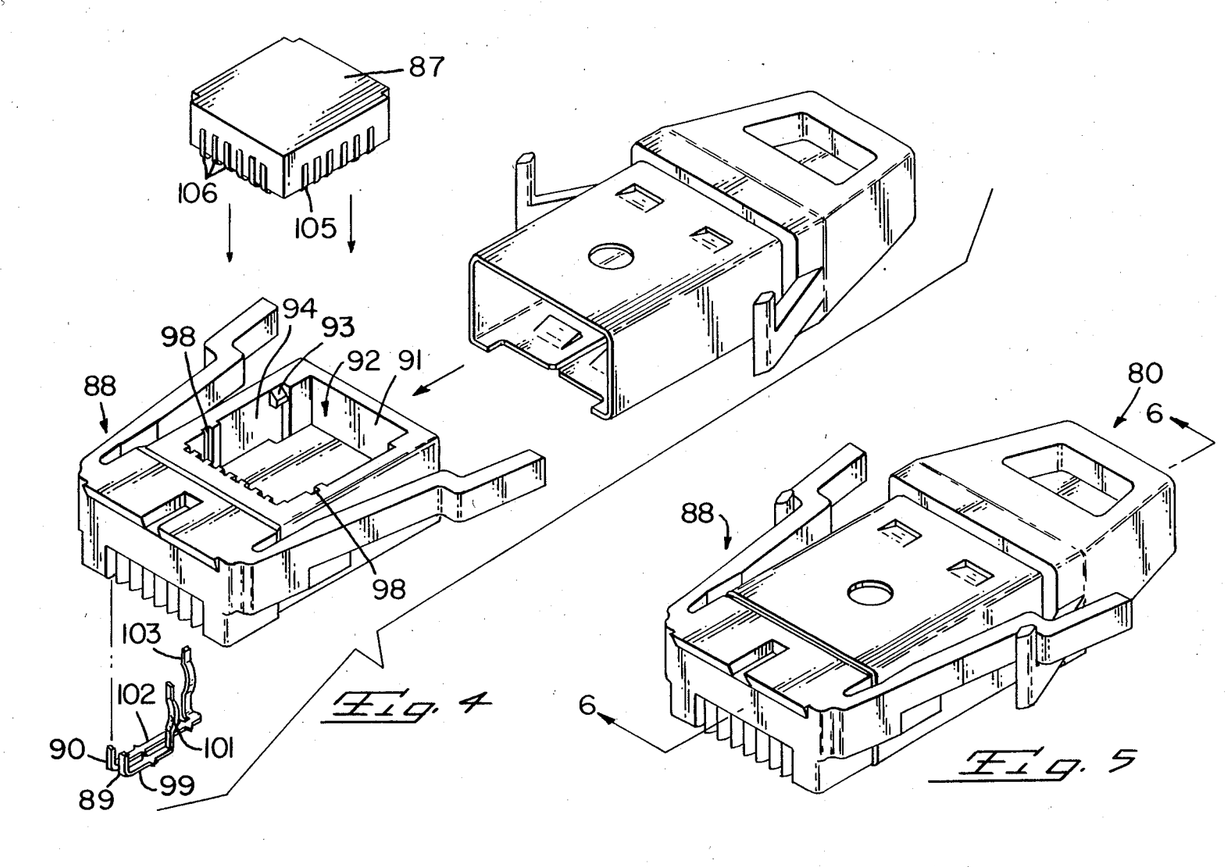
FIG. 4 is an exploded isometric view of a second example of a key assembly according to the invention.
FIG. 5 is an isometric view of the assembly of FIG. 4.
Figure 7:
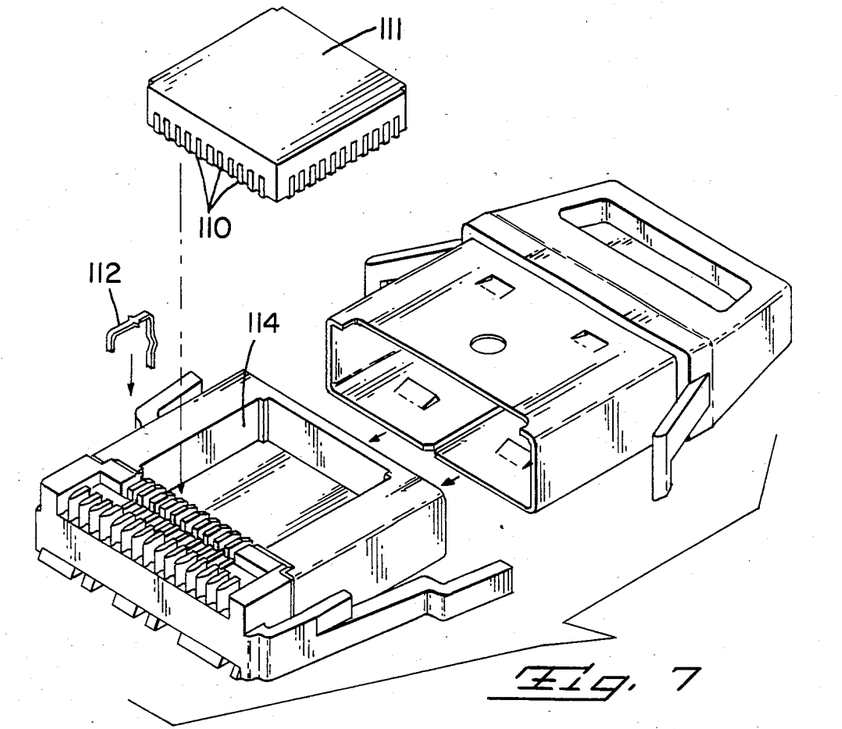
FIG. 7 is an exploded isometric view of a third example of a key assembly according to the invention.
Figures 10, 11:
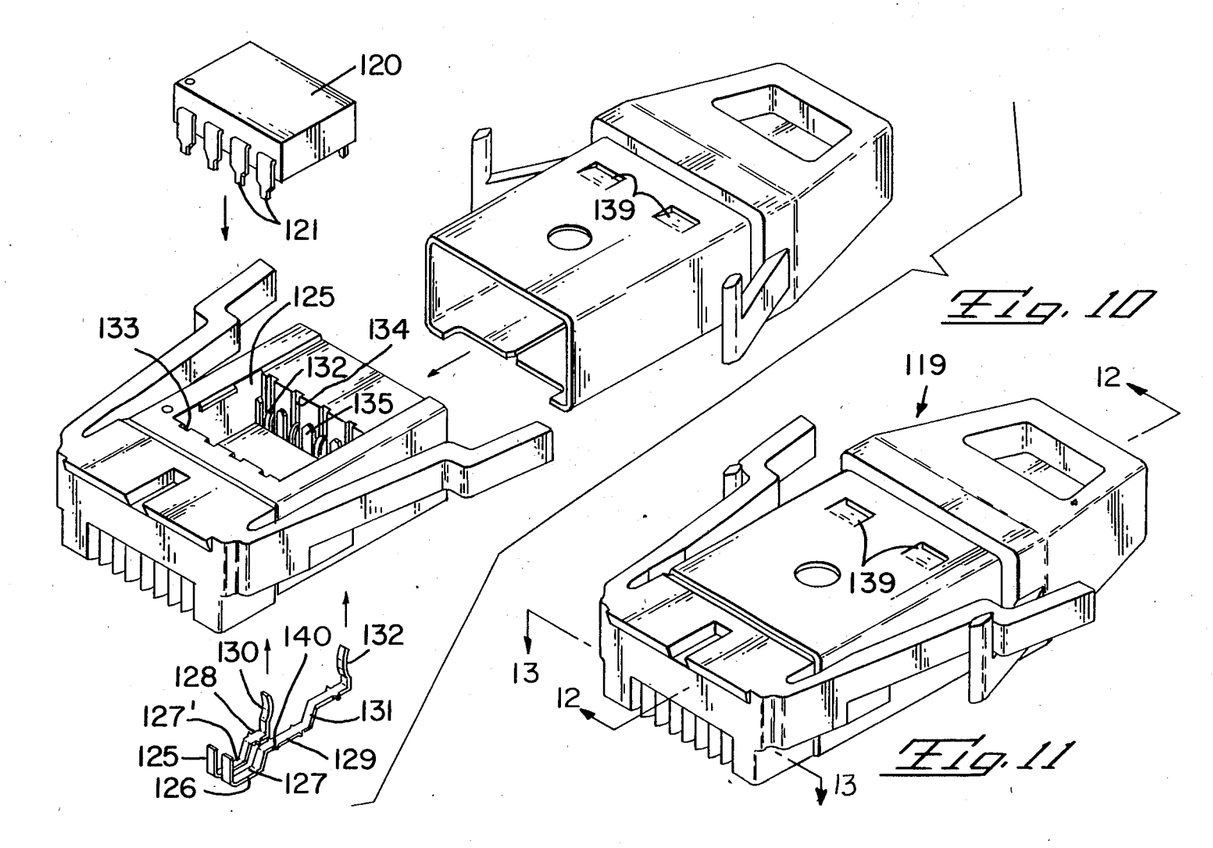
FIG. 10 is an exploded isometric view of a fourth example of a key assembly according to the invention.
FIG. 11 is an isometric view of the assembly of FIG. 10.

In the second and subsequent examples of key assemblies 80, 109 and 119, respectively, the shield and fingerpiece are substantially identical to that of the first example. Similarly, the external profile of the plug body is substantially identical to that of the first example except in relation to dimensions and coding features. Other features of difference which adapt the plug to accommodate different chip carrier structures are described below.

Figure 6:
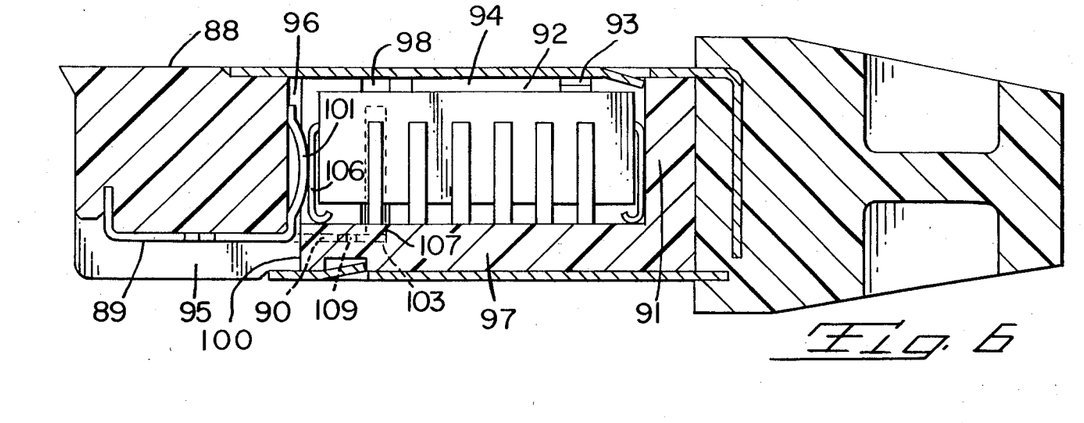
FIG. 6 is a cross-sectional view of the assembly taken along line 6—6 of FIG. 5.

In the second example, shown in inverted position in FIGS. 4 to 6, the plug body 88 and contacts 89 and 90 are designed to provide an eight line connection to a standard twenty-four line chip carrier 87. In this example, the rear wall 91 of the cavity 92 is imperforate, the base being open to admit the chip carrier, latching detents 93 being provided on side walls 94 to retain the chip carrier in position. A series of spaced barriers 95 extend rearwardly and continuously from the front end along one side and down a front wall 96 of the cavity. The top of the cavity is closed by a wall 97 and contact admitting passageways 100 are provided for second contact portions of contacts 89 entering the cavity. A pair of grooves 98 extend vertically along opposite side walls adjacent the front wall.

The six central contacts 89 are identical, with first contact portions 99 located between barriers 95 and second contact portions 101 extending through passageways 100 down along the front wall bowed away from the wall to form beam springs. The outer two contacts 90 have longer first contact portions that extend into grooves in wall 97 then through 90 degrees to extend downwardly through passageways 107 at the junction of side and top walls 94 and 97 so that second contact portions 103 extend along the grooves in the side wall forming similar beam springs, but aligned with leads 105. Barbs such as indicated at 109 assist in retaining the contacts in the housing.

This enables the chip carrier to be press-fitted into the cavity through the open base with contact portions 101 connecting to the row of six leads 106 on one face of the carrier and contact portions 103 connecting to the one adjacent lead 105 on each adjacent face.

Figure 8:
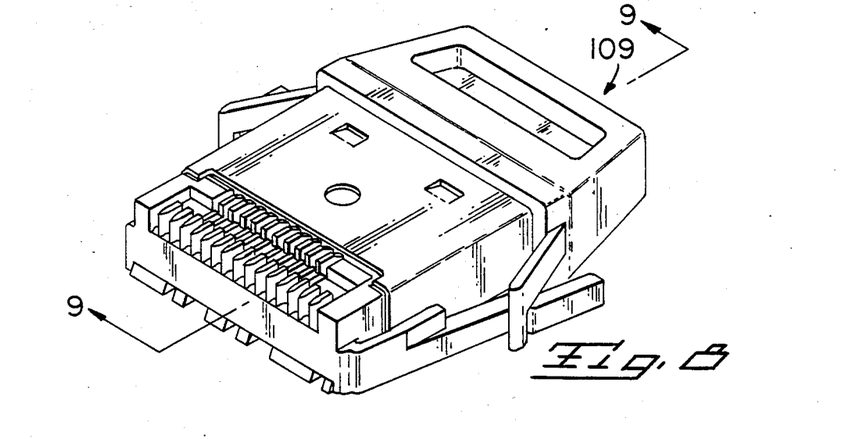
FIG. 8 is an isometric view of the assembly of FIG. 7.

In the third example 109 of the invention, eight lines of connection are formed by connection with eight preselected leads 110 of a standard forty-four lead chip carrier 111 using contacts 112 identical to each other and similar to the contacts 89 of the second example. The cavity 114 has a top chip carrier admitting opening and an imperforate base, side and end walls.

Figure 12:
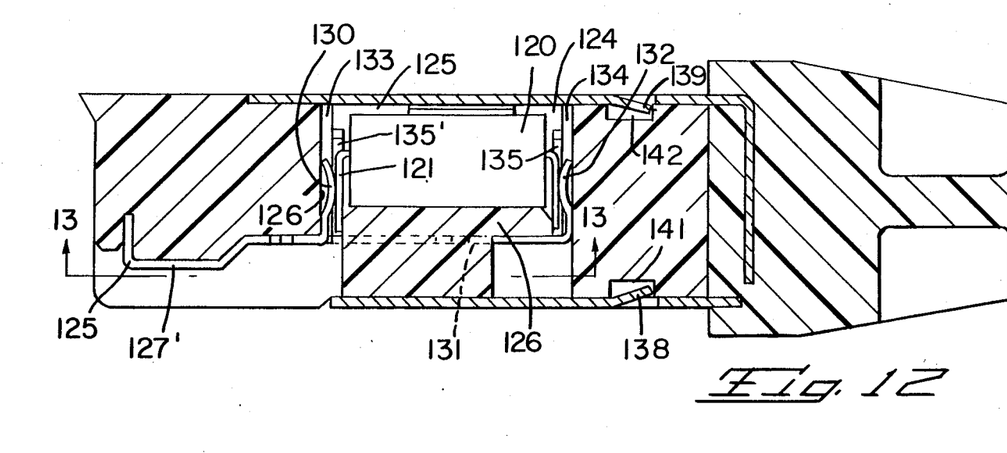
FIG. 12 is a cross-sectional view of the assembly taken along line 12—12 of FIG. 11; and, FIG. 13 is a fragmentary cross-sectional view along line 13—13 of FIG. 11 of the fourth example showing the contact layout.
Figure 13:
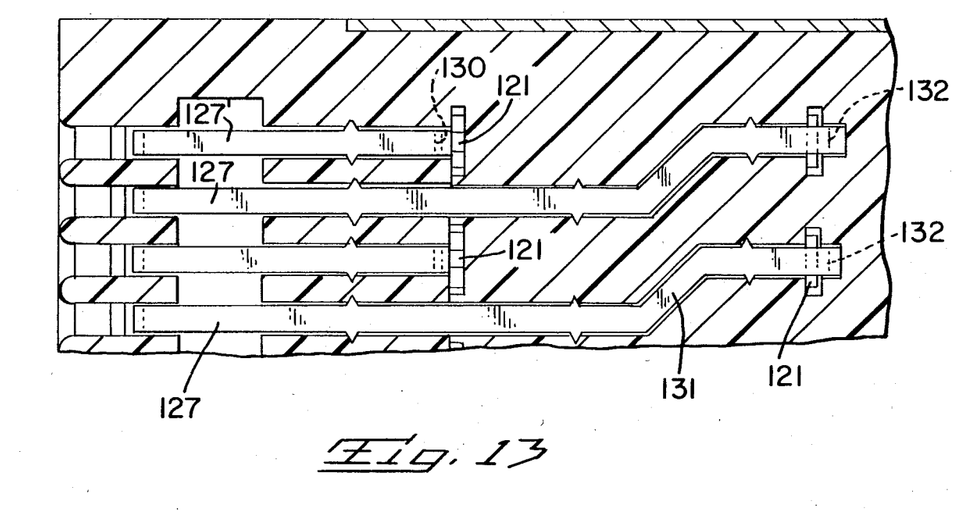

In the fourth example 119, shown in inverted position in FIGS. 10–12, the chip carrier has the form of a dual-in-line package 120 with four leads 121 on each of a pair of opposite faces. The cavity 124 is formed with a chip carrier admitting opening 125 at the base and a top wall 126 spaced in part from the top side of the plug. Four, spaced apart, contacting receiving passageways 133, 134 extend through the top wall 126 adjacent a front and rear wall of the cavity communicating with the cavity and the space, opening to form grooves extending along the front and rear cavity walls. Between the grooves extend lead guiding ribs 135, 135' which both assist in isolating adjacent contacts received in the grooves and the adjacent chip carrier leads 121 and assist in guiding the leads into the grooves.

The two sets of contacts 125, 126 are of different lengths for receipt in the forward and rearward grooves 133 and 134, respectively. The sets have identical first contact portions 127, 127' but the body portions 128 of contacts 125 are relatively short so that their second, bowed, contact portions 130 extend through passageways 133 and are received in the grooves on the front wall of the cavity. The body portions 129 of contacts 126 are relatively long and stepped across at 131 so that second, bowed, contact portions 132 are received as beam springs in grooves 134 opposite first contact portions 130. Barbs 140 are provided at various positions along the contacts to retain them as an interference fit in the grooves.

In this example, the shield latching detents 138, 139 are received in recesses 141, 142 on upper and lower sides of the plug body adjacent the rear.

We claim:

1. An electronic key assembly comprising an insulating plug body moulded from plastics material having a front, mating end for receipt in a jack and a rear end and formed with a chip carrier receiving cavity spaced rearwardly from the mating end;
   - a row of contact receiving recesses extending rearwardly from the mating end along a side of the body towards the cavity;
   - a series of contacts having first contact portions mounted in the recesses for engagement with spring contacts of a complementary jack and second spring contact portions extending into the cavity for engagement with respective leads of a chip carrier received in the cavity;
   - releasable latch arm means extending rearwardly from the mating end; and,
   - a sleeve-form shield receivable on the body surrounding the rear end and extending forwardly over the cavity to the mating end thereby completely to enclose and shield the chip carrier in the cavity.

2. An electronic key assembly according to claim 1 in which the shield is anchored in a fingerpiece at one axial end.

3. An electronic key assembly according to claim 2 in which anti-overstress means extends forwardly from the fingerpiece trapping the latch arm means to prevent excessive movement thereof away from the body.

4. An electronic key assembly according to claim 3 in which the latch arm means is formed with a forwardly facing shoulder adjacent its rear end and the anti-overstress means comprises a rearwardly facing hook engaging the shoulder.

5. An electronic key assembly according to claim 4 in which the latch arm means is stepped outwardly towards its free ends to provide the shoulder.

6. An electronic key assembly according to claim 4 in which the fingerpiece is moulded from plastics material with the anti-overstress means integral therewith, the shield being inmoulded with the fingerpiece.

7. An electronic key assembly according to claim 1 in which the contacts are of first and second types, the first and second portions of the first contact type are axially in line and located in the body with second contact portions of the first contact type extending adjacent a front wall of the cavity, the second contact types being laterally stepped so that their second contact portions are laterally offset from their first contact portions and the second contact types being located in the body on opposite ends of the series of contacts such that their second contact portions extend into the cavity along side walls of the cavity adjacent the front wall.

8. An electronic key assembly according to claim 1 in which the contacts are of first and second types, the first and second contact portions of the first contact type are axially in line, with second contact portions adjacent a front wall of the cavity, the second type contacts being longer than the first type contacts thereby to span the cavity and being laterally stepped such that their second contact portions are laterally offset from their first contact portions, the first and second contact(s) types being arranged in alternating fashion such that the second contact portions of the second type contacts are adjacent a rear wall of the cavity aligned opposite second contact portions of the adjacent first type contacts.

9. An electronic key assembly comprising an insulating plug body moulded from plastics material having a front, mating end for receipt in a jack and a rear end and formed with a chip carrier receiving cavity spaced rearwardly from the mating end;
   - a row of contact receiving recesses extending rearwardly from the mating end along a side of the body towards the cavity;
   - a series of contacts having first contact portions mounted in the recesses and exposed along the side of the body adjacent the mating end for engagement with spring contacts of a complementary jack and second spring contact portions extending into the cavity for engagement with respective leads of a chip carrier received in the cavity; and,
   - releasable, resilient, latch arm means extending rearwardly from the mating end.

10. An electronic key assembly according to claim 9 in which anti-overstress means extends laterally of the plug body trapping the latch arm means adjacent its free end to prevent excessive movement thereof away from the body.

11. An electronic key assembly according to claim 10 in which the latch arm means is arranged to be trapped in the anti-overstress means by a snap action during resilient flexure of the latch arm toward the plug body.

12. An electronic key assembly according to claim 9 in which the contacts are of first and second types, the first and second contact portions of the first contact type are axially in line and located in the body with second contact portions of the first contact type extending adjacent a front wall of the cavity, the second contact types being laterally stepped so that their second contacts portions are laterally offset from their first contact portions and the second contact types being located in the body on opposite ends of the series of contacts such that their second contact portions extend into the cavity along side walls of the cavity adjacent the front wall.

13. An electronic key assembly according to claim 9 in which the contacts are of first and second types, the first and second contact portions of the first contact type are axially in line, with second contact portions adjacent a front wall of the cavity, the second type contacts being longer than the first type contacts thereby to span the cavity and being laterally stepped such that their second contact portions are laterally offset from their first contact portions, the first and second contact types being arranged in alternating fashion such that the second contact portions of the second type contacts are adjacent a rear wall of the cavity aligned opposite second contact portions of the adjacent first type contacts.

14. An electronic key assembly according to claim 9 in which the first contact portions provide a smooth, unsheared surface exposed for engagement with spring contacts of a complementary jack.

15. An electronic key assembly according to claim 1 which the first contact portions provide a smooth, unsheared surface exposed for engagement with spring contacts of a complementary jack.

* * * * *